United States Patent
Lesartre et al.

(10) Patent No.: US 10,312,943 B2
(45) Date of Patent: Jun. 4, 2019

(54) ERROR CORRECTION CODE IN MEMORY

(71) Applicant: HEWLETT PACKARD ENTERPRISE DEVELOPMENT LP, Houston, TX (US)

(72) Inventors: Gregg B. Lesartre, Fort Collins, CO (US); Craig Warner, Plano, TX (US); Martin Foltin, Fort Collins, CO (US); Chris Michael Brueggen, Plano, TX (US); Brian S. Birk, Corvallis, OR (US); Harvey Ray, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 39 days.

(21) Appl. No.: 15/468,619

(22) Filed: Mar. 24, 2017

(65) Prior Publication Data

US 2018/0276068 A1   Sep. 27, 2018

(51) Int. Cl.
*H03M 13/00* (2006.01)
*H03M 13/29* (2006.01)
(Continued)

(52) U.S. Cl.
CPC ..... *H03M 13/2906* (2013.01); *G06F 11/1048* (2013.01); *G11C 29/52* (2013.01);
(Continued)

(58) Field of Classification Search
CPC . G06F 11/1068; H03M 13/2906; G11C 29/52
See application file for complete search history.

(56) References Cited

U.S. PATENT DOCUMENTS 7,904,791 B2   3/2011   Hwang et al.
8,010,875 B2   8/2011   Gara et al.
(Continued)

OTHER PUBLICATIONS

Nair, P.J. et al., "Citadel: Efficiently Protecting Stacked Memory From Large Granularity Failures," (Research Paper), 2015, 7 pages, available at https://www.cs.utah.edu/thememoryforum/nair.pdf.
(Continued)

*Primary Examiner* — Thien Nguyen
(74) *Attorney, Agent, or Firm* — Hewlett Packard Enterprise Patent Department (57) ABSTRACT

In one example in accordance with the present disclosure, a system comprises a plurality of memory dies, a first region of memory allocated for primary ECC spread across a first subset of at least one memory die belonging to the plurality of memory die, wherein a portion of the primary ECC is allocated to each data block and a second region of memory allocated for secondary ECC spread across a second subset of at least one memory die included in the plurality of memory die. The system also comprises a memory controller configured to determine that an error within the first data block cannot be corrected using a first portion of the primary ECC allocated to the first data block, access the second region allocated for secondary ECC stored on the at least one memory die belonging to the plurality of memory die and attempt to correct the error using the primary and secondary ECC.

20 Claims, 7 Drawing Sheets

(51) Int. Cl.
*G11C 29/52* (2006.01)
*G06F 11/10* (2006.01)
*G11C 29/04* (2006.01)

(52) U.S. Cl.
CPC ............... *G11C 2029/0409* (2013.01); *G11C 2029/0411* (2013.01)

(56) References Cited

U.S. PATENT DOCUMENTS

| | | |
|---|---|---|
| 8,468,416 B2 | 6/2013 | Gara et al. |
| 9,195,551 B2 | 11/2015 | Das et al. |
| 2009/0193314 A1* | 7/2009 | Melliar-Smith ............................ H03M 13/2921 714/755 |
| 2012/0079351 A1* | 3/2012 | Cideciyan ........... G06F 11/1048 714/764 |
| 2012/0246546 A1* | 9/2012 | Melliar-Smith ............................ H03M 13/2921 714/776 |
| 2018/0011762 A1* | 1/2018 | Klein .................. G06F 11/1072 |

OTHER PUBLICATIONS

Nair, P.J. et al., "XED: Exposing On-Die Error Detection information for Strong Memory Reliability," (Research Paper), 2015, 13 pages, available at http://www.prism.gatech.edu/~pnair6/isca43/XED-ISCA43.pdf.

* cited by examiner

ERROR CORRECTION CODE IN MEMORY

BACKGROUND

In some memory modules each cache line of stored data may be accompanied with an error correction code (ECC) in order to provide a capability to recognize, and correct errors in some of the stored bits such that good data may be consistently provided to an accessing system.

BRIEF DESCRIPTION OF THE DRAWINGS

The following detailed description references the drawings, wherein.

DETAILED DESCRIPTION

The systems and methods describe herein may allow for a memory module capable of supporting data and ECC organized across parallel accessed memory die, augmented by additional ECC. ECC memory refers to memory containing additional data providing an error correction code that is used for detecting and correcting internal data corruption. ECC memory may be used to store data values, such as an error correction code word and/or a portion of a code word that can be compared to other data values to detect and/or correct data corruption. For example, electrical or magnetic interference may cause single bit of memory to flip to an incorrect state (i.e. from a "0" state to a "1" state, or vice versa).

In the case that the ECC data correction logic cannot determine the correct data from the ECC, the additional ECC may be read to allow correction of more bit errors such that a higher overall data reliability is achieved. In this way memory read performance may not be significantly impacted by additional ECC other than in the rare case that the extra ECC is required to determine the correct data.

With this mechanism, a memory module may modally support a baseline memory quality achieving higher capacities and performance attributes or a lower quality (i.e. higher BER or bit error rate) memory with a modest impact to capacity, performance and power consumption, or a higher memory reliability with a baseline memory quality. This approach provides both flexibility to offer different product options as well as program resiliency to utilize higher BER memory die before memory technology has matured sufficiently to supply higher quality (lower BER) parts.

A system for error correction code in memory may comprise a plurality of memory dies (sometimes referred to as "chips"), wherein a plurality of data blocks are spread across the plurality of memory dies. The system may also comprise a first region of memory allocated for primary error correcting code (ECC) spread across a first subset of at least one memory die belonging to the plurality of memory die, wherein a portion of the primary ECC is allocated to each data block, and a second region of memory allocated for secondary ECC spread across a second subset of at least one memory die included in the plurality of memory die. The system may also comprise a memory controller configured to determine that an error within the first data block cannot be corrected using a first portion of the primary ECC allocated to the first data block, access the second region allocated for secondary ECC stored on the at least one memory die belonging to the plurality of memory die, wherein the first region allocated for primary ECC is separate from the second region and attempt to correct the error using the primary and secondary ECC.

Figure 1A:
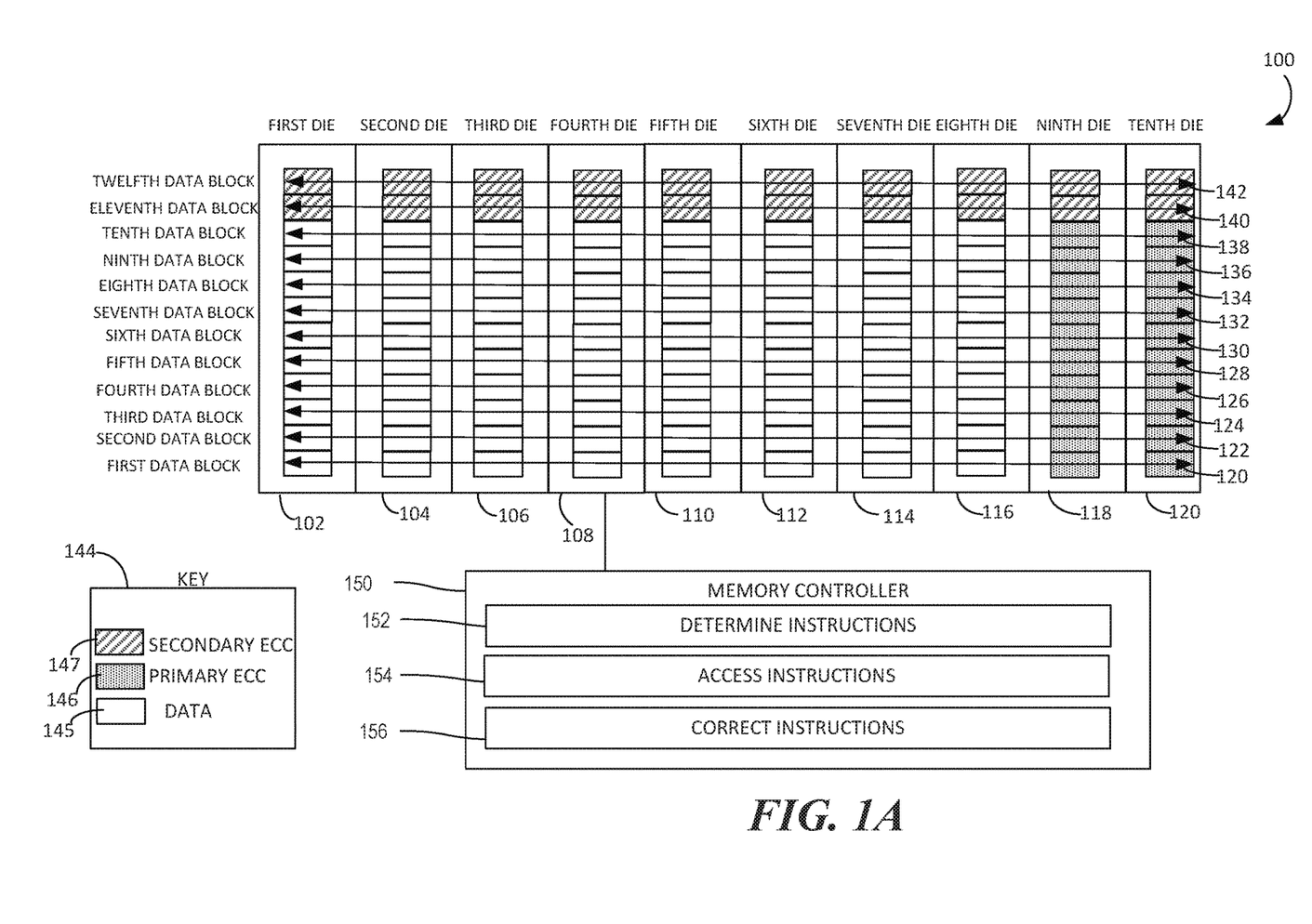
FIG. 1A is a block diagram of an example memory module.

FIG. 1A is a block diagram of an example memory module 100. The memory module may be, for example, a dual in-line memory module (DIMM). Memory module 100 may include a plurality of dies including first die 102, second die 104, third die 106, fourth die 108, fifth die 110, sixth die 112, seventh die 114, eighth die 116, ninth die 118 and tenth die 120. Although the example memory module 100 illustrated in FIG. 1 includes ten dies, other number of dies may be used in memory modules consistent with the present disclosure. Each die may provide 8 bytes each. Access to the 10 memory die may be achieved by 5 electrically independent interfaces (not pictured) each accessing 2 memory die. Although the memory module 100 has one rank, this is for the sake of illustration and multiple ranks of memory dies may be provided on the memory module to achieve memory capacities greater than that which can be provided by 1 rank of 10 die. In these aspects, the primary ECC and/or secondary ECC may be spread across dies and across the different ranks.

A plurality of data blocks may be spread across the plurality of dies, such that a portion of each data block is on each die. In the example memory module 100 illustrated in FIG. 1, twelve data blocks 120, 122, 124, 126, 128, 130, 132, 134, 136, 138, 140 and 142 are spread across the plurality of dies. As illustrated in FIG. 1, each data block is spread across the ten die and thus each data block may have ten portions. Each data block may be a total of 80 bytes and each portion may be 8 bytes. Of course, other numbers of data blocks may be used consistent with the present disclosure.

Some, or all, of the portions of first die 102, second die 104, third die 106, fourth die 108, fifth die 110, sixth die 112, seventh die 114 and eight die 116 may be allocated for normal data usage. For example, in FIG. 1, 8 portions (corresponding to the first die 102-eighth die 116) may be allocated for normal data usage. As illustrated by key 144, the portion of the die allocated for normal data usage in FIG. 1 is indicated by a first pattern 145. A portion of ninth die 118 and a portion of tenth die 120 corresponding to each data block may be allocated for primary Error Correcting Code (ECC) memory. For example, In FIG. 1 the first data block 120 through the tenth data block 138 may have 2 portions for primary ECC. In some aspects, such as the one illustrated in FIG. 1, ninth die 118 and tenth die 120 may not have any blocks allocated for normal data usage.

As illustrated by key 144, the portion of the die allocated for primary ECC in FIG. 1 is indicated by a second pattern 146. Accordingly, FIG. 1 illustrates a memory module with a primary configuration that provides 64 bytes of data for normal data usage and 16 bytes of data for primary ECC resulting in an 80 byte data block spread across the 10 die. This primary configuration may be referred to as an 8+2 configuration. Under certain circumstances, such as for memory die achieving a preferred lower bit error rate (BER), the primary ECC may deliver sufficient memory module reliability for most application cases.

To achieve acceptable reliability using memory with higher BER, or to achieve higher than standard reliability with lower BER memory, memory module 100 may operate in a secondary data configuration that allocates extra ECC to enable correctibility of more bit errors on a data block. For example, in FIG. 1A, the secondary data configuration may provide the memory module with an extra 2 die worth of ECC (an extra 16 bytes). This example secondary data configuration may be referred to as 8+2+2 configuration. In the secondary configuration, usable data capacity is reduced in order to provide storage for secondary ECC.

Figure 1B:
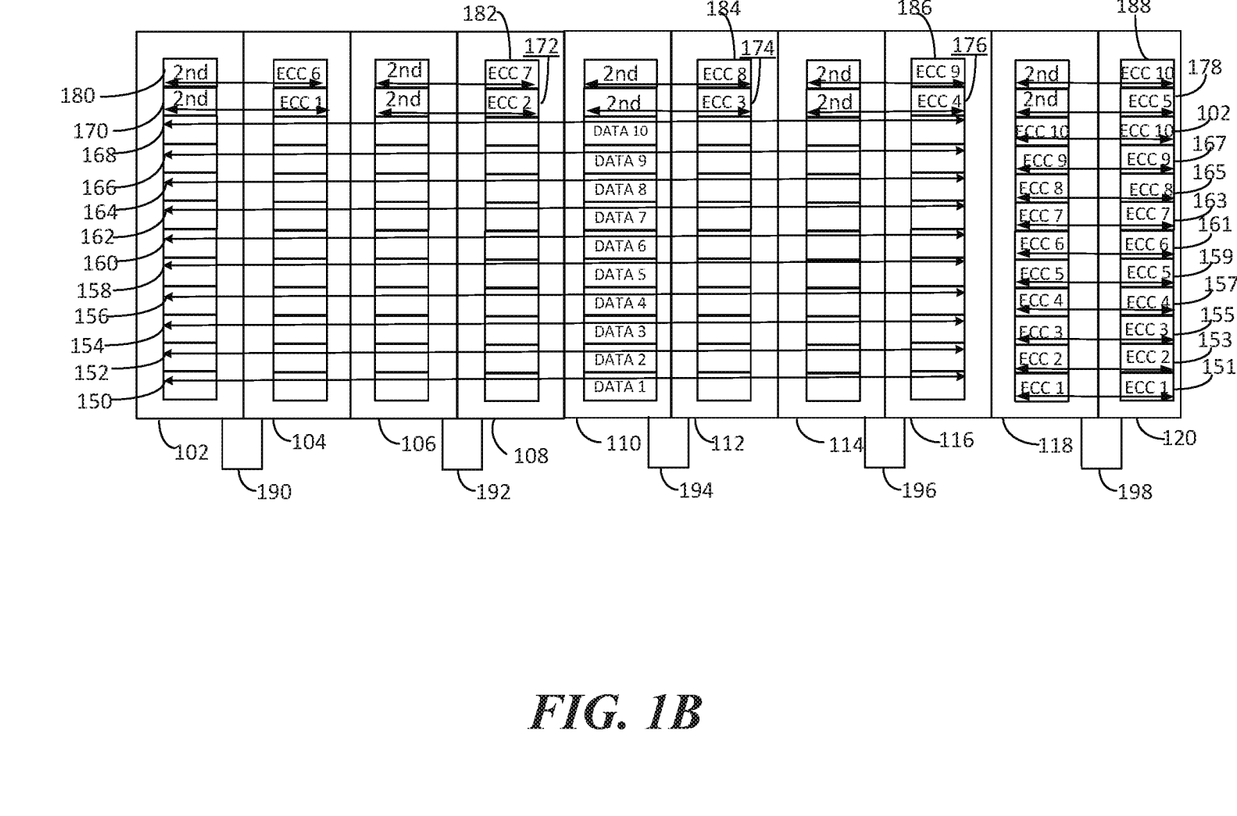
FIG. 1B is another block diagram of an example memory module.

A second region of memory allocated for secondary ECC is spread across a second subset of at least one memory die included in the plurality of memory die. In the example illustrated in FIG. 1, first data block 120 and second data block 122 may be allocated for secondary ECC. Accordingly, a portion of first die 102, second die 104, third die 106, fourth die 108, fifth die 110, sixth die 112, seventh die 114, eighth die 116, ninth die 118 and tenth die 120 may be allocated for secondary ECC usage. As illustrated by key 144, the portion of the die allocated for secondary ECC in FIG. 1 is indicated by a third pattern 147. Some of data blocks 124-142 may have portions (i.e. twelfth data block 142 and/or eleventh data block 140) allocated for secondary ECC. This is illustrated in further detail in FIG. 1B.

Turning to FIG. 1B, a block diagram of an example memory module 100 is illustrated. As illustrated in FIG. 1A, memory module 100 includes a plurality of dies including first die 102, second die 104, third die 106, fourth die 108, fifth die 110, sixth die 112, seventh die 114, eighth die 116, ninth die 118 and tenth die 120. Similarly, memory module 100 includes twelve data blocks (not numbered) spread across the plurality of dies. Each data block may have a group of portions for normal data usage for the data block.

A first region of memory allocated for primary error correcting code (ECC) may be spread across a first subset of at least one memory die belonging to the plurality of memory die, wherein a portion of the primary ECC is allocated to each data block. For example, first data block 120 from FIG. 1A may have a group 150 of portions for primary data usage for the first data block (data 1) and a group 151 of portions for corresponding primary ECC (ECC 1). Second data block 122 may have a group 152 of portions for primary data usage for the second data block (data 2) and a group 153 of portions for corresponding primary ECC (ECC 2). Third data block 124 may have a group 154 of portions for primary data usage for the third data block (data 3) and a group 155 of portions for corresponding primary ECC (ECC 3). Fourth data block 126 may have a group 156 of portions for primary data usage for the fourth data block (data 4) and a group 157 of portions for corresponding primary ECC (ECC 4). Fifth data block 128 may have a group 158 of portions for primary data usage for the fifth data block (data 5) and a group 159 of portions for corresponding primary ECC (ECC 5). Sixth data block 130 may have a group 160 of portions for primary data usage for the sixth data block (data 6) and a group 161 of portions for corresponding primary ECC (ECC 6). Seventh data block 132 may have a group 162 of portions for primary data usage for the seventh data block (data 7) and a group 163 of portions for corresponding primary ECC (ECC 7). Eighth data block 134 may have a group 164 of portions for primary data usage for the eighth data block (data 8) and a group 165 of portions for corresponding primary ECC (ECC 8). Ninth data block 126 may have a group 136 of portions for primary data usage for the ninth data block (data 9) and a group 167 of portions for corresponding primary ECC (ECC 9). Tenth data block 138 may have a group 168 of portions for primary data usage for the tenth data block (data 10) and a group 169 of portions for corresponding primary ECC (ECC 10).

Moreover, each of data blocks 124-142 may have a corresponding amount of secondary ECC. In some aspects, each portion may be 8 bytes large and thus a data block may have 16 bytes of secondary ECC storage. For example, eleventh data block 140 may have a group 170 of portions for secondary ECC for the first data block ($2^{ND}$ ECC 1). The group 170 may be on second data block 122 spread across first die 102 and second die 104. Eleventh data block 140 may have a group 172 of portions for secondary ECC for the second data block ($2^{ND}$ ECC 2). The group 172 may be on second data block 122 spread across third die 106 and fourth die 108. Eleventh data block 140 may have a group 174 of portions for secondary ECC for the third data block ($2^{ND}$ ECC 3). The group 174 may be on second data block 122 spread across fifth die 110 and sixth die 112. Eleventh data block 140 may have a group 176 of portions for secondary ECC for the fourth data block ($2^{ND}$ ECC 4). The group 176 may be on second data block 122 spread across seventh die 114 and eight die 116. Eleventh data block 140 may have a group 178 of portions for secondary ECC for the fifth data block ($2^{ND}$ ECC 5). The group 178 may be on second data block 122 spread across ninth die 118 and tenth die 120.

Likewise, twelfth data block 142 may have a group 180 of portions for secondary ECC for the sixth data block ($2^{ND}$ ECC 6). The group 180 may be on first data block 120 spread across first die 102 and second die 104. The group 182 may be on first data block 120 spread across third die 106 and fourth die 108. Twelfth data block 142 may have a group 184 of portions for secondary ECC for the seventh data block ($2^{ND}$ ECC 7). The group 184 may be on first data block 120 spread across fifth die 110 and sixth die 112. Twelfth data block 142 may have a group 186 of portions for secondary ECC for the eight data block ($2^{ND}$ ECC 8). The group 186 may be on first data block 120 spread across seventh die 114 and eight die 116. Third data block 124 may have a group 188 of portions for secondary ECC for the ninth data block ($2^{ND}$ ECC 9). The group 188 may be on first data block 120 spread across ninth die 118 and tenth die 120. Twelfth data block 142 may have a group 182 of portions for secondary ECC for the tenth data block ($2^{ND}$ ECC 10).

The secondary ECC may be encoded in a manner to augment the baseline primary ECC scheme such that when data is read, normally the primary ECC is sufficient to detect and correct errors in data. In the case that the ECC data correction logic cannot determine the correct data from the primary ECC the corresponding secondary ECC data may be read to allow correction of more bit errors such that a higher overall data reliability is achieved. In this way memory read performance may not be impacted by the secondary scheme other than in the cases that the secondary ECC is used to determine the correct data. Accordingly, latency, bandwidth, and power read metrics may be consistent between the primary and secondary configuration.

A plurality of electrical interfaces may connect the memory die, each electrical interface connected to at least one memory die collectively holding the first secondary ECC portion. For example, electrical interface 190 may connect first die 102 and second die 104, electrical interface 192 may connect third die 106 and fourth die 108, electrical interface 194 may connect fifth die 110 and sixth die 112, electrical interface 196 may connect sixth die 114 and seventh die 116 and electrical interface 198 may connect eighth die 118 and ninth die 120. Of course this is merely for example and other numbers of electrical interfaces can be used and different numbers of dies may be connected by each electrical interface.

Turning again to FIG. 1A, memory module 100 may also include a memory controller 140. Memory controller 140 may be a hardware unit embedded inside the module-level memory controller. Memory controller 140 may include a programmable processor embedded in the memory/media controller. Instructions may be loaded on the memory controller 140 by firmware. In the example illustrated in FIG. 1A, memory module 100 may fetch, decode, and execute instructions 152, 154 and 156.

Memory controller 150 may execute determine instructions 152 to determine that an error within a data block (i.e. one or more of data blocks 124-142) on memory module 100 cannot be corrected using a corresponding portion of the primary ECC allocated to the data block. Memory controller 150 may execute access instructions 154 to access the second region allocated for secondary ECC stored on at least one memory die belonging to the plurality of memory die, wherein the first region allocated for primary ECC is separate from the second region. Memory controller 150 may execute correct instructions 152 to attempt to correct the error using the primary and secondary ECC.

In other words, when the memory controller 150 cannot identify and/or correct data using the primary ECC, the memory controller 150 may enter the secondary configuration and the secondary ECC may be accessed. Using the primary and secondary ECC may allow correction of more bit errors such that a higher overall data reliability is achieved. Accordingly, the memory module 100 may be hardware configured to operate in multiple modes, including a mode using the primary ECC (i.e. 8+2 mode) and a mode using the primary ECC and secondary ECC (i.e. 8+2+2 mode).

For example, a memory module in the primary configuration mode (using the primary ECC) using a Reed-Solomon error correction code scheme may have 15 redundant bytes. Note that the size of the code word may be equal to 10 die times 8 Byte per die. In some aspects, the memory module may use a 65 Byte payload (64 Byte data block+1 Byte metadata), allowing the memory module to correct failures in up to 8 Byte and may have a tolerated BER$\leq 3*10^{-5}$. Although, these are example code scheme and payload sizes and other sizes may be used. A memory module in the secondary configuration mode (using the primary ECC and the secondary ECC) may see an improvement in this regard. For example, using the combined ECC, the memory module may use a 96 byte code word with 31 redundant Bytes. The size of the code word may be equal to 15 bytes plus the additional 16 bytes of secondary ECC. Using the same 65 Byte sized payload (64 Byte data block+1 Byte metadata), the memory module may correct failures in up to 16 Bytes and have a tolerated BER of $5*10^{-4}$. Although, these are merely example code word and payload sizes and other sizes may be used.

A memory module may experience the failure of one of the memory die that contribute data or ECC to a data block. This die may then be erased from the data block, meaning the error correction logic will factor in the knowledge of the failure when correcting data. A memory module in the secondary configuration mode (using the primary ECC and the secondary ECC) may see an improvement in this regard to its ability to correct further bit errors after erasure has occurred. Before an erasure event, in most read transactions, the lower ECC bits may usually be accessed. When the memory module 100 is operating in secondary mode, writes to memory may update the data blocks, the primary ECC and the secondary ECC. These extra writes to the secondary ECC may impact the bandwidth of the memory and negatively impact performance of the memory module. The memory controller 150 may reduce the write bandwidth impact of secondary ECC write using an allocation buffer.

In the example configuration describe above reference to FIGS. 1A and 1B each data block may be 64 bytes, may have a corresponding primary ECC that is 16 bytes and may have a corresponding secondary ECC that is 16 bytes. Accordingly, a write may include updating both the base line 80 data block bytes (64 byte data block and 16 byte primary ECC) and the extra 16 bytes of secondary ECC.

To reduce the write bandwidth impact of the secondary ECC write, the control of the electrical interfaces between the controller and the memory die(s) may be enhanced to allow each electrical interface to issue unique write addresses. Each electrical interface may connect two die. In the example memory module 100 of FIGS. 1A and 1B, there may be 5 total electrical interfaces, each connected to two of the ten die (102-120). In this way multiple secondary ECC writes may be performed in parallel, with secondary ECC blocks sharing a data block. Each set of secondary ECC blocks may be 16 bytes and the data block used for the secondary ECC may be 80 bytes. As shown in FIGS. 1A and 1B, there may be more than one data block used for secondary ECC. The memory controller 150 may process a write in two parts: the first part including the data blocks and primary ECC and the second part including the secondary ECC.

Using the example sizes described above, each write may include an 80 byte write that follows the standard primary configuration write flow, and a spawned 16 byte write transaction that targets a deterministic secondary ECC address, and a deterministic electrical interface (one of 5). Rather than issue the 16 byte spawned write immediately, the spawned write may be loaded into an accumulation buffer. The accumulation buffer may be used for gathering writes to different electrical interfaces and grouping die into groups of writes that can be issued in parallel. Grouped writes arbitrate with the data block for access to memory when a full group is complete, when forced because address conflicts are recognized, or pushed out of the accumulation buffer to make room to accumulate more.

Using the accumulation buffer in this way when in the secondary configuration mode, the memory module may achieve between 85% and approximately 70% of the write bandwidth supported in the primary configuration mode, depending on write address access patterns. Write power consumption may increases proportionally to the number of additional ECC bits.

Within the first rank (such as memory module 100 illustrated in FIGS. 1A and 1B), certain dies may have secondary ECC and primary ECC both stored within the particular memory die. For example, in FIGS. 1A and 1B, tenth memory die 120 has part of group 159 of portions for primary ECC for the fifth data block (ECC 5) and part of group 178 of portions for secondary ECC for the fifth data block ($2^{ND}$ ECC 5). In the case of an erasure event, these portions may not be recoverable. Accordingly, in some aspects, portions of the secondary ECC corresponding to a memory die in one rank of memory die may be stored on a memory die in another rank. By swapping where these secondary ECC portions are stored within multiple ranks, the system may prevent this loss of data.

In one example a plurality of memory die may be spread across two ranks. A first region of memory allocated for primary ECC may be spread across a first subset of at least one memory die belonging to the plurality of memory die and a second region of memory allocated for secondary ECC may be spread across a second subset of at least one memory die included in the plurality of memory die. The first subset may include a memory die on a first rank of memory die and the second subset may include a memory die on a second rank of memory die.

Figure 2:
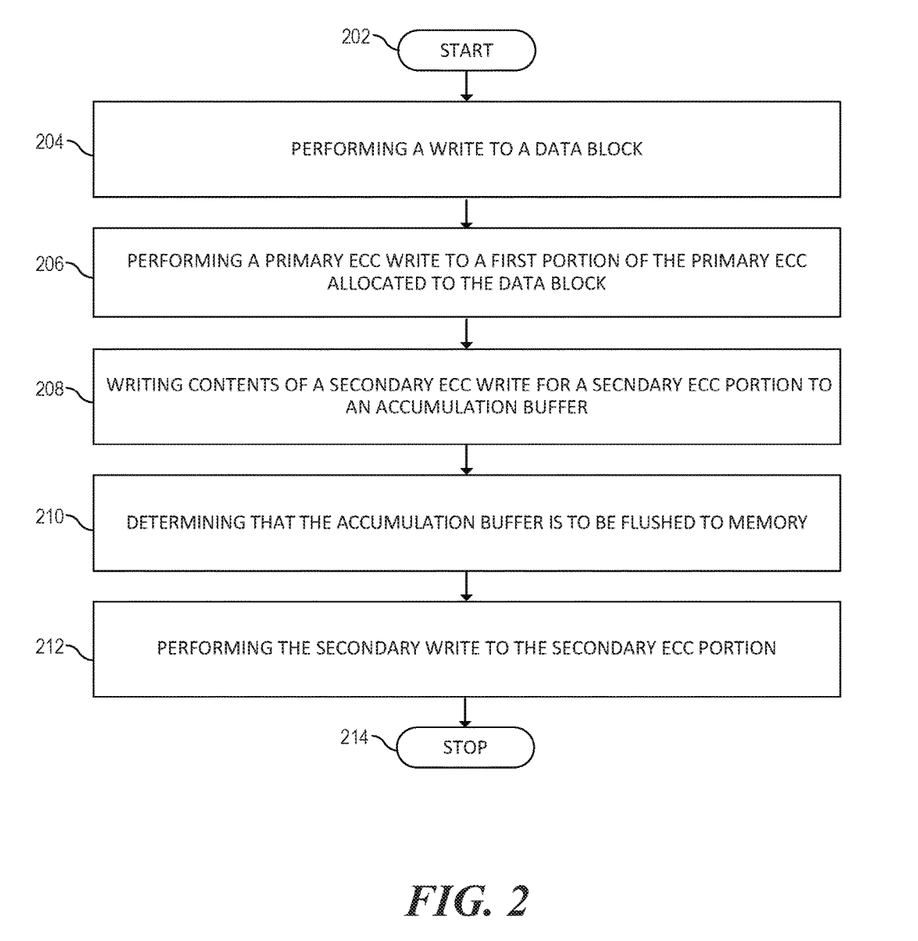
FIG. 2 is a flowchart of an method for performing ECC writes using an accumulation buffer.
Figure 3:
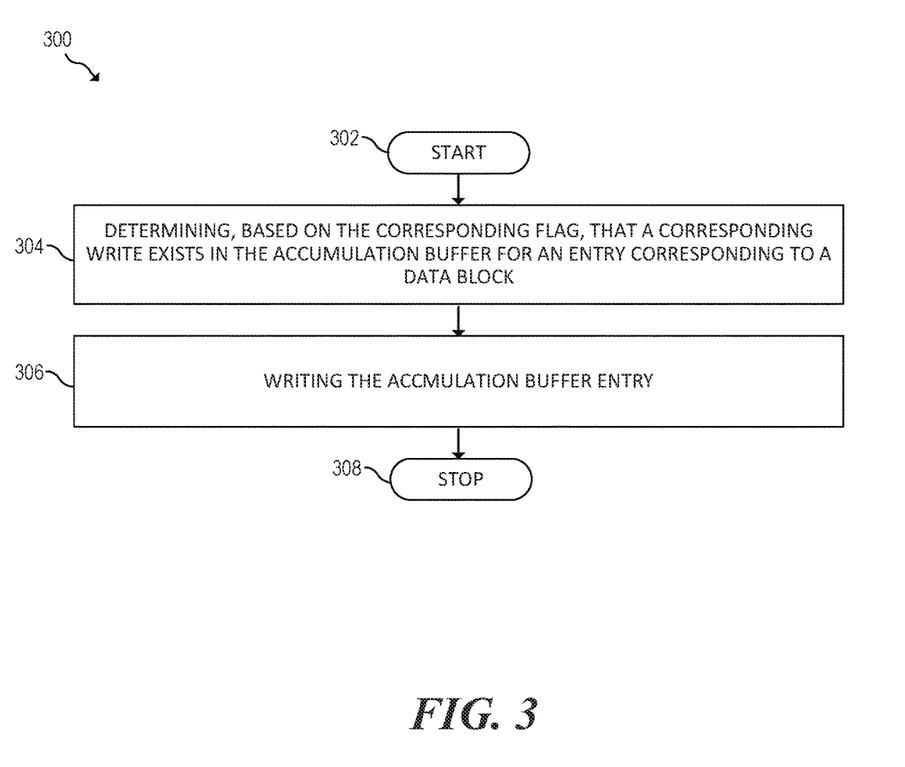
FIG. 3 is a flowchart of another example method for performing ECC writes using an accumulation buffer.
Figure 4:
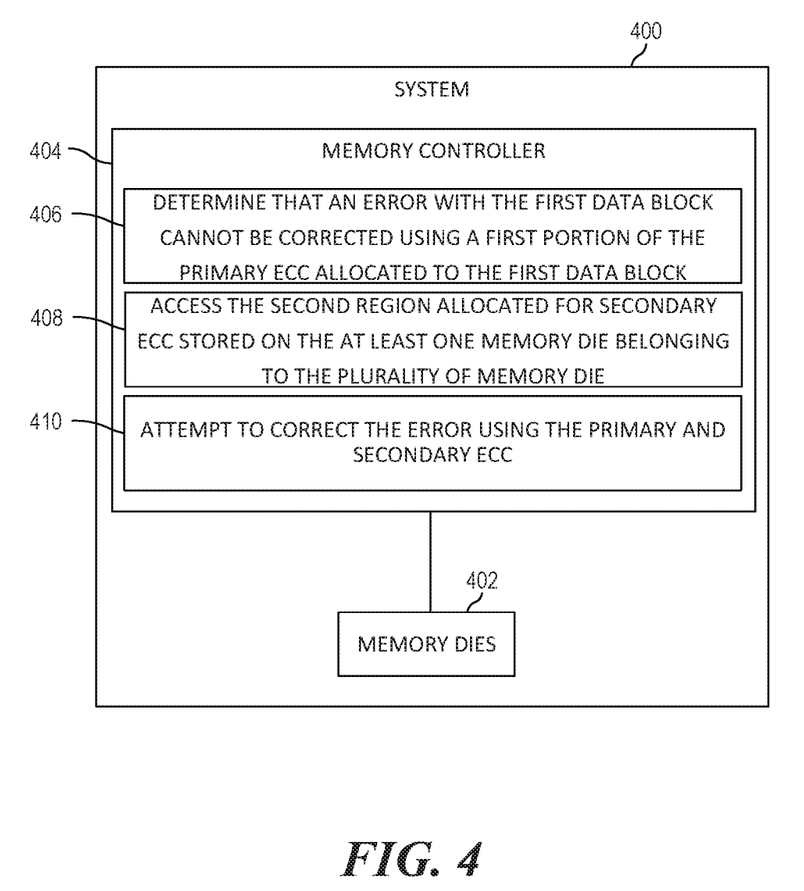
FIG. 4 is a block diagram of an example system for error correction code in memory.

Referring now to FIGS. 2-3, flowcharts are illustrated in accordance with various examples of the present disclosure. The flowcharts represent processes that may be utilized in conjunction with various systems and devices as discussed with reference to the preceding figures, such as, for example, system 100 described in reference to FIGS. 1A and 1B, system 400 described in reference to FIG. 4 and/or system 600 described in reference to FIG. 6. While illustrated in a particular order, the flowcharts are not intended to be so limited. Rather, it is expressly contemplated that various processes may occur in different orders and/or simultaneously with other processes than those illustrated. As such, the sequence of operations described in connection with FIGS. 2-4 are examples and are not intended to be limiting. Additional or fewer operations or combinations of operations may be used or may vary without departing from the scope of the disclosed examples. Thus, the present disclosure merely sets forth possible examples of implementations, and many variations and modifications may be made to the described examples.

FIG. 2 is a flowchart of an example method 200 for performing ECC writes using an accumulation buffer. Method 200 may be performed, for example, by a memory controller, similar to the memory module 150 of FIG. 1A, that is part of a memory module similar to memory module 100 of FIGS. 1A and 1B. The memory module may include 10 memory dies, such as memory dies 102-120 and a plurality of electrical interfaces connecting the memory die. Each electrical interface may be connected to at least one memory die collectively holding the first secondary ECC portion. For example, a first electrical interface may connect the first die 102 and the second die 104. Although references may be made to FIG. 1A and FIG. 1B in the description of method 200, this is for illustration purposes.

Method 200 may start at block 202 and continue to block 204, where the method 200 may include performing a write to a data block. The data block may be similar to, for example, twelfth data block 142 of memory module 100 as illustrated in FIG. 1A. The method 200 may be used with other elements of FIG. 1A, other memory modules, etc. At block 206, the method may include performing a primary ECC write to a first portion of the primary ECC allocated to the data block. Turning to FIG. 1B, the primary ECC allocated to the twelfth data block 142 may be group 151 of portions. At block 208, the method may include writing contents of a secondary ECC write for the secondary ECC portion. The contents of the secondary ECC may include a write to the first and second portion of the secondary ECC corresponding to the data block. Turning again to FIG. 1B, the secondary ECC may be group 170 of portions. A first portion of group 170 may be on the first die 102 and the second portion of group 170 may be on the second die 104.

At block 210, the method may include determining that the accumulation buffer is to be flushed to memory. It may be determined that the accumulation buffer is to be flushed to memory based on a variety of circumstances.

In other aspects, it may be determined that the accumulation buffer is to be emptied when a write exists in the accumulation buffer for each die and/or data block in the memory module. In other aspects, it may be determined that the accumulation buffer is to be emptied, for example when a second write for a given memory die is to be written to the accumulation buffer before a previous write has been committed to the memory module, etc. In another example, it may be determined that the accumulation buffer is to be emptied due to a resource contention in the accumulation buffer, which may or may not match the address. In another example, it may be determined that the accumulation buffer is to be emptied based on an address conflict when a read needs that specific extra ECC data.

For example, it may be determined that the accumulation buffer is to be flushed to memory, when a write exists in the accumulation buffer for each die connected to a given electrical interface. For example, in one aspect a first electrical interface may connect the first die 102 and the second die 104. The allocated secondary ECC on the first die 102 and the second die 104 may correspond to the first data block 120 and sixth data block 130. As illustrated in FIG. 1B, the secondary ECC for the first data block 120 may be group 170 of portions and the secondary ECC for the sixth data block 130 may be group 180 of portions. A first portion of group 170 may be on the first die 102 and the second portion of group 170 may be on the second die 104. Similarly, a first portion of group 180 may be on the first die 102 and the second portion of group 180 may be on the second die 104.

In one aspect, the method may determine that a second extra ECC write for sixth data block may flush an accumulated extra ECC write for the first block to open room in the accumulation buffer. The method may determine that the accumulation buffer is to be emptied. Accordingly, the method may include flushing the accumulated extra ECC write for the first block from the accumulation buffer.

At block 212, the method may include performing the write to the secondary ECC. Using the above example, the method may perform a secondary ECC write corresponding to the sixth data block to the first and second portions (from group of portions 180) of the secondary ECC on the first and second memory die.

For example, the memory controller may determine that the accumulation buffer includes a secondary ECC write corresponding to a data block having a second secondary ECC portion spread across the at least one die belonging to the plurality of die and perform the first and second secondary ECC writes.

In some aspects, some of the secondary ECC writes may be performed in parallel. For example, the writes to the secondary ECC on dies that do not share an electrical interface may be done in parallel.

For example, the memory controller may determine that the accumulation buffer includes a secondary ECC write corresponding to a data block having a secondary ECC portion spread across a first die that does not share an electrical interface with at least one die and perform the first and second secondary ECC writes in parallel.

In either case, the method may proceed to block 214 where the method may end.

FIG. 3 is a flowchart of an example method 300 for performing ECC writes using an accumulation buffer. Method 300 may be performed, for example, by a memory controller, similar to the memory module 150 of FIG. 1A, that is part of a memory module similar to memory module 100 of FIGS. 1A and 1B. Although references may be made to FIG. 1A and FIG. 1B in the description of method 200, this is for illustration purposes. The memory module may include a plurality of data blocks, such as data blocks 120-142, spread across a plurality of memory dies, such as memory dies 102-120. The memory module may utilize an accumulation buffer with a flag corresponding to each accumulation buffer entry indicating whether a write for that memory interface, rank and bank is in the accumulation buffer. In other words a flag may exist for each of the possible slots within the accumulation buffer that a secondary ECC write may map to. The accumulation buffer may have an entry for each combination of rank, bank, and interface. A rank is a set of memory dies (memory chips) connected to the same chip select. For example, the example memory module 100 illustrated in FIG. 1A is one rank of ten memory die (chips). Banks are sub-units of areas inside of each memory die. An interface is a protocol for communication between units of memory.

Method 300 may start at block 302 and continue to block 304, where the method may include determining, based on the corresponding flag, that a corresponding write exists in the accumulation buffer. As described above, the accumulation buffer entry may correspond to a combination of rank, bank and interface for the third and fifth data blocks. At block 306, the method may include writing the accumulation buffer entry corresponding to the third data block and a fifth data block. The method may proceed to block 308, where the method may end.

FIG. 4 is a block diagram of an example system 400 for error correction code in memory. System 400 may include a plurality of memory die 402 and memory controller 404 that may be coupled to each other through a communication link. A plurality of data blocks may be spread across the plurality of memory die 402. A first region of memory allocated for primary error correcting code (ECC) may be spread across a first subset of at least one memory die belonging to the plurality of memory die 402. A portion of the primary ECC may be allocated to each data block. A second region of memory allocated for secondary ECC may be spread across a second subset of at least one memory die included in the plurality of memory die 402. Memory controller 404 may include one or multiple Central Processing Units (CPU) or another suitable hardware processors. System 400 may include instructions to be executed by memory controller 404 including instructions 406, 408, and 410.

In some aspects, the plurality of memory die 402 may include ten memory die, a first plurality of regions, including the first region, allocated for primary ECC, a second plurality of regions, including the second regions, allocated for secondary ECC and each of the data blocks in the plurality of data blocks within the ten memory die. In some aspects, system 400 may also include a plurality of electrical interfaces, each electrical interface connected to at least one memory die collectively holding the first secondary ECC portion.

Memory controller 404 may execute instructions 406 to determine that an error within the first data block cannot be corrected using a first portion of the primary ECC allocated to the first data block. Memory controller 404 may execute instructions 408 to access the second region allocated for secondary ECC stored on at least one memory die belonging to the plurality of memory die. The first region may be allocated for primary ECC separately from the second region. Memory controller 404 may execute instructions 410 to attempt to correct the error using the primary and secondary ECC.

Figure 5:
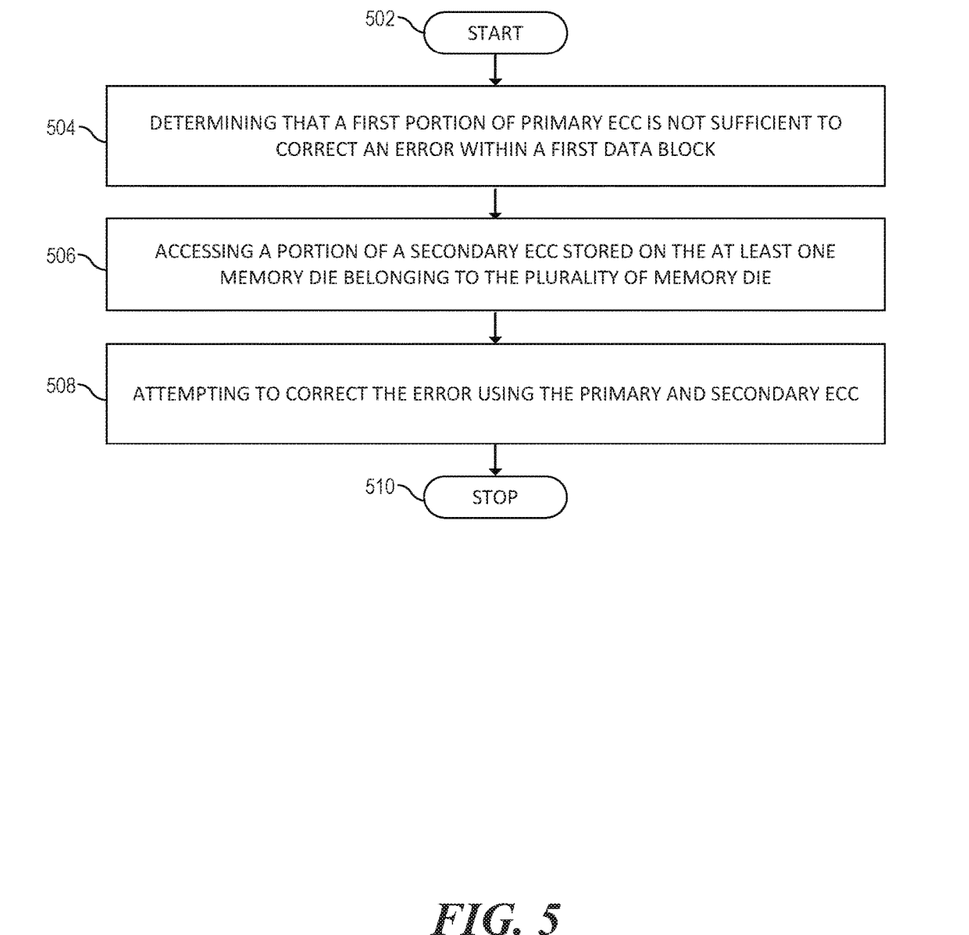
FIG. 5 is a flowchart of an example method for performing ECC writes.

FIG. 5 is a flowchart of an example method 500 for performing ECC reads. The flowchart represents a process that may be utilized in conjunction with various systems and devices as discussed with reference to the preceding figures, such as, for example, system 100 described in reference to FIGS. 1A and 1B, system 400 described in reference to FIG. 4 and/or system 600 described in reference to FIG. 6. While illustrated in a particular order, the flowchart is not intended to be so limited. Rather, it is expressly contemplated that various processes may occur in different orders and/or simultaneously with other processes than those illustrated. As such, the sequence of operations described in connection with FIG. 5 are examples and are not intended to be limiting. Additional or fewer operations or combinations of operations may be used or may vary without departing from the scope of the disclosed examples. Thus, the present disclosure merely sets forth possible examples of implementations, and many variations and modifications may be made to the described examples.

Method 500 may start at block 502 and continue to block 504, where the method may include determining that a first portion of primary ECC is not sufficient to correct an error within a first data block. A first region of memory allocated for primary error correcting code (ECC) may be spread across a first subset of at least one memory die belonging to a plurality of memory die.

The plurality of memory die may include ten memory die, a first plurality of regions, including the first region, allocated for primary ECC, a second plurality of regions, including the second regions, allocated for secondary ECC and each of the data blocks in the plurality of data blocks within the ten memory die. A plurality of electrical interfaces may connect the memory die, each electrical interface connected to at least one memory die collectively holding the first secondary ECC portion At block 506, the method may include accessing a portion of a secondary ECC stored on at least one memory die belonging to the plurality of memory die. The second region of memory allocated for secondary ECC may be spread across a second subset including at least one memory die and the first region is separate from the second region. At block 508, the method may include attempting to correct the error using the primary and secondary ECC. The method may proceed to block 510, where the method may end.

Figure 6:
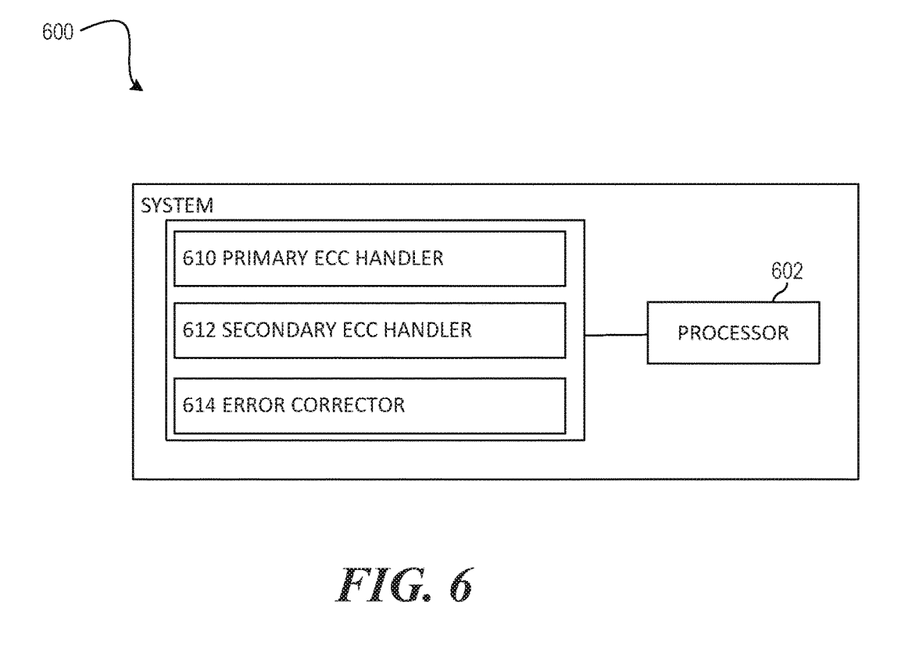
FIG. 6 is a block diagram of another example system for error correction code in memory.

FIG. 6 is a block diagram of an example system 600 for error correction code in memory. System 600 may include a processor 602 that may include one or multiple Central Processing Units (CPU) or another suitable hardware processors. Processor 602 may be part of a memory controller. System 600 may include instructions to be executed including instructions for first ECC handler 606, second ECC handler 608, and error corrector 610.

System 600 may also be coupled to a plurality of die. In some aspects, the plurality of memory die may include ten memory die, a first plurality of regions, including the first region, allocated for primary ECC, a second plurality of regions, including the second regions, allocated for secondary ECC and each of the data blocks in the plurality of data blocks is within the ten memory die. In some aspects, system 600 may also include a plurality of electrical interfaces, each electrical interface connected to at least one memory die collectively holding the first secondary ECC portion.

Processor 602 may execute instructions of primary ECC handler 610 to determine that a first portion of primary ECC is not sufficient to correct an error within a first data block. A first region of memory may be allocated for primary error correcting code (ECC) spread across a first subset of at least one memory die belonging to a plurality of memory die. Processor 602 may execute instructions of secondary ECC handler 612 to access a portion of a secondary ECC stored on the at least one memory die belonging to the plurality of memory die. A second region of memory may be allocated for secondary ECC spread across a second subset including at least one memory die and the first region is separate from the second region. Processor 602 may execute instructions of error corrector 614 to attempt to correct the error using the primary and secondary ECC.

The foregoing disclosure describes a number of examples for time slot determination. The disclosed examples may include systems, devices, computer-readable storage media, and methods for time slot determination. For purposes of explanation, certain examples are described with reference to the components illustrated in FIGS. 1-8. The functionality of the illustrated components may overlap, however, and may be present in a fewer or greater number of elements and components. Further, all or part of the functionality of illustrated elements may co-exist or be distributed among several geographically dispersed locations. Further, the disclosed examples may be implemented in various environments and are not limited to the illustrated examples.

Further, the sequence of operations described in connection with FIGS. 1-8 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples.

The invention claimed is:

1. A system comprising:
a plurality of memory dies on a memory module, wherein a plurality of data blocks are spread across the plurality of memory dies;
a first region of memory allocated for primary error correcting code (ECC) spread across at least a first subset of a first memory die belonging to the plurality of memory die, wherein a portion of the primary ECC is allocated to each data block;
a second region of memory allocated for secondary ECC spread across at least a second subset of the first memory die and a third subset of a second memory die included in the plurality of memory die; and
a memory controller configured to:
determine that an error within a first data block cannot be corrected using a first portion of the primary ECC allocated to the first data block from the first region of memory;
access the second region allocated for secondary ECC stored at least on the first and second memory die, wherein the first region allocated for primary ECC is separate from the second region; and
correct the error using the primary and secondary ECC.

2. The system of claim 1, the memory controller configured to:
perform a write to the first data block;
perform a primary ECC write to first portion of the primary ECC allocated to the first data block;
write contents of a secondary ECC write for the secondary ECC portion in an accumulation buffer;
determine that the accumulation buffer is to be flushed to memory; and
perform the secondary ECC write to the secondary ECC portion.

3. The system of claim 2, the memory controller configured to:
determine that a second secondary FCC portion spread across a first die that does not share an electrical interface with the at least one die;
determine that the accumulation buffer includes a second secondary ECC write corresponding to a fifth data block having a second secondary ECC portion spread across the first die that does not share the electrical interface with the at least one die; and
performing the first and second secondary ECC writes in parallel.

4. The system of claim 1 comprising a plurality of electrical interfaces, each electrical interface connected to at least one memory die collectively holding the first secondary ECC portion.

5. The system of claim 1 wherein the secondary ECC is stored on a first ECC portion of a third data block on the third die and a second ECC portion of the third data block on the fourth die, wherein the first ECC portion and the fourth portion provide secondary ECC for a fourth data block.

6. The system of claim 5, wherein an accumulation buffer has a plurality of flags corresponding to a plurality of accumulation buffer entries, each accumulation buffer entry corresponding to a combination of rank, bank, and interface, the memory controller configured to:
determine, based on the corresponding flag, that a corresponding write exists in the accumulation buffer for a first entry corresponding to a data block belonging to the plurality of data blocks; and
writing contents of a first accumulation buffer entry to memory.

7. The system of claim 1 Therein the first subset, storing the first region of memory allocated for primary ECC, includes a memory die on a first rank of memory die and the second subset, storing the second region of memory allocated for secondary ECC, includes a memory die on a second rank of memory die.

8. The system of claim 1 wherein the plurality of memory die includes ten memory die, a first plurality of regions, including the first region, allocated for primary ECC, a second plurality of regions, including the second regions, allocated for secondary ECC and each of the data blocks in the plurality of data blocks is within the ten memory die.

9. A method comprising:
determining, by a memory controller, that a first portion of primary ECC is not sufficient to correct an error within a first data block, wherein a first region of memory allocated for primary error correcting code (ECC) is spread across at least a first subset of a first memory die belonging to a plurality of memory die on a memory module;
accessing, by the memory controller, a second portion of a secondary ECC, wherein a second region of memory allocated for the secondary ECC is spread across at least a second subset of the first memory die and a third subset of a second memory die belonging to the plurality of memory die and the first region is separate from the second region; and
correcting, by the memory controller, the error using the primary and secondary ECC.

10. The method of claim 9 comprising:
performing a write to the first data block;
performing a primary ECC write to first portion of the primary ECC allocated to the first data block;

writing contents of a secondary ECC write for the secondary ECC portion in an accumulation buffer;
determining that the accumulation buffer is to be flushed to memory; and
writing the secondary ECC write to the secondary ECC portion.

11. The method of claim 10, comprising:
determining that the accumulation buffer includes a second secondary ECC write corresponding to a fourth data block having a second secondary ECC portion spread across the at least one die belonging to the plurality of die; and
performing the first and second secondary ECC writes.

12. The method of claim 10, comprising:
determining that a first die that does not share an electrical interface with the at least one die;
determining that the accumulation buffer includes a second secondary ECC write corresponding to a fifth data block having a second secondary ECC portion spread across the first die that does not share the electrical interface with the at least one die; and
performing the first and second secondary ECC writes in parallel.

13. The method of claim 10, wherein an accumulation buffer has a flag corresponding to each memory address in the data block indicating whether a write for that memory address is in the accumulation buffer, the method comprising:
determining, based on the corresponding flag, that a corresponding write exists in the accumulation buffer for each memory address in the third data block and a fifth data block corresponding to the secondary ECC; and
writing the contents of a first accumulation buffer entry to memory.

14. The method of claim 10, wherein a plurality of electrical interfaces connect the plurality of memory die, each electrical interface connected to at least one memory die collectively holding the first secondary ECC portion.

15. A system comprising:
a primary ECC handler to determine that a first portion of primary ECC is not sufficient to correct an error within a first data block, wherein a first region of memory allocated for primary error correcting code (ECC) spread across a first subset of at least one memory die belonging to a plurality of memory die on a memory module;
a secondary ECC handler to access a portion of a secondary ECC, wherein a second region of memory allocated for secondary ECC is spread across at least a second subset of the first memory die and a third subset of a second memory die belonging to the plurality of memory die and the first region is separate from the second region; and
an error corrector to correct the error using the primary and secondary ECC.

16. The system of claim 15 wherein the plurality of memory die includes ten memory die, a first plurality of regions, including the first region, allocated for primary ECC, a second plurality of regions, including the second regions, allocated for secondary ECC and each of the data blocks in the plurality of data blocks is within the ten memory die.

17. The system of claim 15 comprising a plurality of electrical interfaces, each electrical interface connected to at least one memory die collectively holding the first secondary ECC portion.

18. The system of claim 15 wherein the secondary ECC is stored on a first ECC portion of a third data block on the third die and a second ECC portion of the third data block on the fourth die, wherein the first ECC portion and the fourth portion provide secondary ECC for a fourth data block.

19. The system of claim 15, comprising:
an ECC writer to:
perform a write to the first data block;
perform a primary ECC write to first portion of the primary ECC allocated to the first data block;
write contents of a secondary ECC write for the secondary ECC portion in an accumulation buffer;
determine that the accumulation buffer is to be flushed to memory; and
write the secondary ECC write to the secondary ECC portion.

20. The system of claim 15, the ECC writer to:
determine that the accumulation buffer includes a second secondary ECC write corresponding to a fourth data block having a second secondary ECC portion spread across the at least one die belonging to the plurality of die; and
performing the first and second secondary ECC writes.

* * * * *